US007663401B1

(12) United States Patent
Nguyen et al.

(10) Patent No.: US 7,663,401 B1
(45) Date of Patent: Feb. 16, 2010

(54) MULTIPLEXER INITIALIZATION SYSTEMS AND METHODS

(75) Inventors: Chi Minh Nguyen, San Jose, CA (US); Chan-Chi Jason Cheng, Fremont, CA (US); Timothy S. Swensen, Santa Clara, CA (US); Giai Trinh, Milpitas, CA (US); Yi Chiang, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 105 days.

(21) Appl. No.: 11/556,528

(22) Filed: Nov. 3, 2006

(51) Int. Cl.
*H03K 19/177* (2006.01)
(52) U.S. Cl. ............... 326/41; 326/38; 365/230.02; 365/230.03
(58) Field of Classification Search ............. 326/37–41, 326/47; 365/189, 201, 189.05, 225.7, 230.01–230.08
See application file for complete search history.

(56) References Cited

U.S. PATENT DOCUMENTS 6,055,204 A * 4/2000 Bosshart ............... 365/230.06
6,169,416 B1 * 1/2001 Eaton et al. ............... 326/38
6,249,465 B1 * 6/2001 Weiss et al. .............. 365/200
6,307,794 B1 * 10/2001 Haga ..................... 365/200
6,469,949 B1 * 10/2002 Hsu et al. ................ 365/225.7
6,556,490 B2 * 4/2003 Shubat et al. ............. 365/200
6,570,808 B2 * 5/2003 Lee ...................... 365/230.02
6,605,959 B1 * 8/2003 Morse et al. ............... 326/38
7,176,716 B2 * 2/2007 Madurawe ................ 326/38
7,279,929 B1 * 10/2007 Young .................... 326/41
2002/0085443 A1 * 7/2002 Lee ..................... 365/230.02

* cited by examiner

*Primary Examiner*—Vibol Tan
*Assistant Examiner*—Christopher Lo
(74) *Attorney, Agent, or Firm*—Haynes and Boone, LLP (57) ABSTRACT

A programmable logic device, in accordance with an embodiment of the present invention, includes a plurality of multiplexers, having fuse input terminals and input signal terminals, and a plurality of associated fuses providing fuse signals to the fuse input terminals to control selection of the input signal terminals. The fuses in a first state select a first input signal terminal of the input signal terminals, with a first multiplexer from the plurality of multiplexers receiving a first logic level signal at the first input signal terminal and providing the first logic level signal to the first input signal terminal of a first set of the plurality of multiplexers. The fuses associated with the first set are adapted to be programmed before the fuses associated with the first multiplexer.

22 Claims, 5 Drawing Sheets

MULTIPLEXER INITIALIZATION SYSTEMS AND METHODS

TECHNICAL FIELD

The present invention relates generally to electrical circuits and, more particularly, to multiplexer techniques, such as within a programmable logic device.

BACKGROUND

Multiplexers are used, for example, within a programmable logic device (PLD), such as a field programmable gate array (FPGA) or a complex programmable logic device (CPLD), to provide a portion of a programmable interconnect architecture (e.g., the routing multiplexers). However for a given design, there may be a substantial number of the routing multiplexers that are unused, which may result in a significant amount of current shunted to ground if the routing multiplexer's inverter stage inputs were left to float.

Various conventional approaches are known to drive or latch the inverter stage inputs to a desired logic level. For example, one approach requires that every multiplexer has a multiplexer input selected (i.e., every multiplexer is used, even if its output is not required), with unused multiplexers possibly provided with a supply voltage (Vcc) input signal. However, one drawback with this approach is that the dynamic Icc in the device (e.g., PLD) may be significantly increased, because the unused multiplexer inverters may switch even though their outputs are not needed for the particular design. Furthermore, signal loading, signal fanout, and leakage current issues may be additional drawbacks associated with the unused multiplexers with this approach of holding the unneeded multiplexer in a proper off state via a supplied input signal.

As another example, another conventional approach provides an additional multiplexer input tied to the supply voltage (Vcc) or ground (Vss), which would be selected when the multiplexer is unused. Although there are fewer leakage paths and no fanout issues as compared to the prior approach, this approach however requires an extra fuse (or signal) to control the additional multiplexer input, adds capacitive loading, and requires additional circuitry and silicon area.

As another example, another approach provides an additional transistor to "tie off" a multiplexer inverter stage input to a logical high, while all of the multiplexer inputs are deselected. Although this approach also does not have leakage current or fanout issues, the additional transistor requirement for each multiplexer is a drawback. Furthermore, a corresponding fuse for each multiplexer is required to control the additional transistor or, alternatively, a pulsed control signal may be provided (e.g., a globally-routed signal) to control the additional transistor. However, the pulsed control signal may require a buffering network and may consume a metal track of appreciable width near each multiplexer.

As a result, there is a need for improved multiplexer techniques.

SUMMARY

In accordance with one embodiment of the present invention, a programmable logic device includes a plurality of multiplexers, with each of the multiplexers having fuse input terminals and input signal terminals; a plurality of fuses associated with the plurality of multiplexers and adapted to provide fuse signals to the fuse input terminals to control selection of the input signal terminals; wherein the fuses in a first state select a first input signal terminal of the input signal terminals; wherein a first multiplexer from the plurality of multiplexers is adapted to receive a first logic level signal at the first input signal terminal and provide the first logic level signal to the first input signal terminal of a first set of the plurality of multiplexers; and wherein the fuses associated with the first set are adapted to be programmed before the fuses associated with the first multiplexer.

In accordance with another embodiment of the present invention, an integrated circuit includes a plurality of multiplexers having input signal terminals; means for controlling selection of the input signal terminals, wherein the controlling means in a default state selects a default one of the input signal terminals for each of the plurality of multiplexers; wherein a first multiplexer from the plurality of multiplexers is adapted to receive a first logic level signal at the default input signal terminal and provide the first logic level signal to the default input signal terminal of a first set of the plurality of multiplexers; and wherein the controlling means, transitioning from the default state, provides the selection of the input signal terminals for the first set of the plurality of multiplexers prior to the selection of the input signal terminals for the first multiplexer.

In accordance with another embodiment of the present invention, a method of initializing multiplexers includes programming to configure receiver multiplexers prior to an associated transmitter multiplexer, wherein the associated transmitter multiplexer provides a default output signal and the receiver multiplexers are configured to select the default output signal prior to the programming; and programming to configure the transmitter multiplexer.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
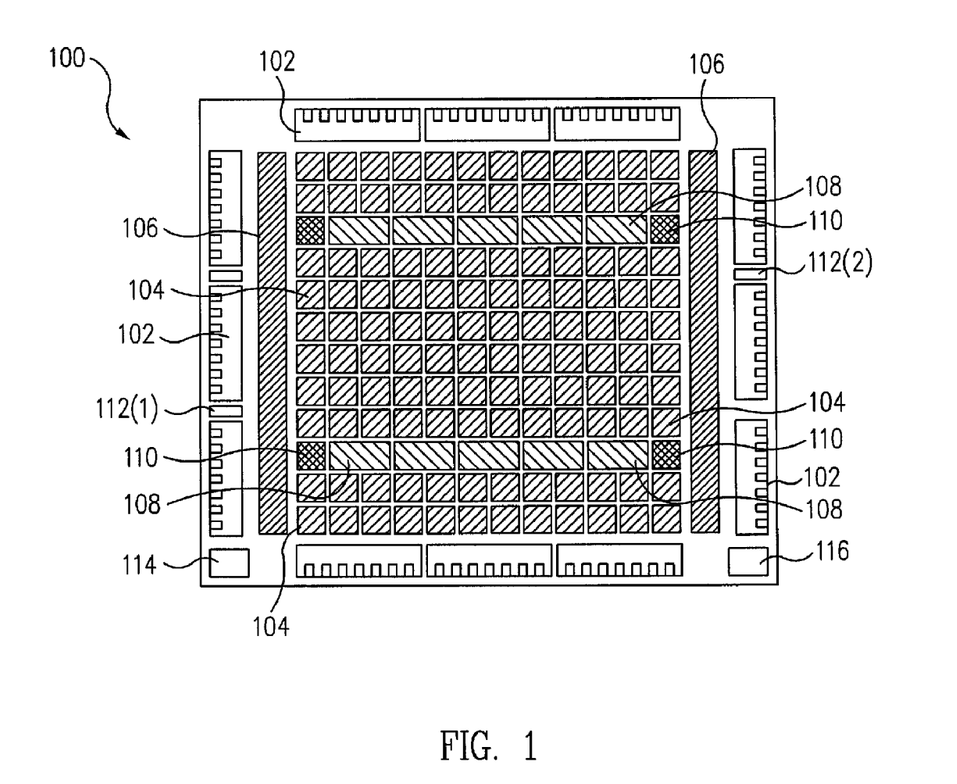
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 generally includes input/output (I/O) blocks 102, programmable logic blocks 104, and an interconnect 116. I/O blocks 102 provide I/O functionality (e.g., supports one or more I/O and/or memory interface standards) for PLD 100. Programmable logic blocks 104 (e.g., also referred to in the art as configurable logic blocks or logic array blocks) provide logic functionality for PLD 100, such as LUT-based logic typically associated with FPGAs or array-based logic typically associated with CPLDs. Interconnect 116 would typically be distributed throughout PLD 100 to provide programmable routing resources.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, and/or configuration memory 114 (e.g., SRAM cells or other volatile or non-volatile memory). Non-volatile memory 106, for example, may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Data port 112 may be used for programming PLD 100, as would be understood by one skilled in the art. For example, data port 112(1) may represent a programming port such as a central processing unit (CPU) port (also referred to as a peripheral data port, a microprocessor interface, or a sysCONFIG programming port) and/or a serial peripheral interface (SPI) port. Data port 112(2) may represent, for example, a programming port such as a joint test action group (JTAG) port by employing standards such as Institute of Electrical and Electronics Engineers (IEEE) 1149.1 or 1532 standards. Data ports 112(1) and 112(2) are not both required, but one or the other or both may be included to receive configuration data and commands, depending upon the desired application and requirements as would be understood by one skilled in the art.

It should be understood that the number and placement of the various elements (some of which may be optional), such as I/O blocks 102, logic blocks 104, non-volatile memory 106, volatile memory 108, clock-related circuitry 110, data port 112, configuration memory 114, and interconnect 116 is not limiting and may depend upon the desired application. Furthermore, it should be understood that the elements are illustrated in block form for clarity and that certain elements, such as configuration memory 114 and interconnect 116 would typically be distributed throughout PLD 100 (e.g., in and between logic blocks 104) to perform their conventional functions (e.g., storing configuration data that configures PLD 100 and providing programmable routing resources, respectively).

In accordance with one or more embodiments of the present invention, multiplexer initialization techniques are provided, which accounts for unused routing multiplexers without requiring additional transistors, associated fuses, and/or global initialization pulse signals as with conventional approaches. The unused multiplexers may be placed in a state that reduces leakage current, while not adding additional dynamic loading or additional fanout loading to the signals provided to the unused multiplexers. For example as explained further herein, the nature of a PLD's routing fabric may be exploited by using certain signals driven from one multiplexer as inputs to many other multiplexers based on multiplexer placement and fuse connection constraints. Furthermore, because the PLD is typically bulk erased and then sequentially programmed, the multiplexers may be initialized with minimum transistor overhead and reduced leakage current and signal loading relative to some conventional approaches.

Figure 2:
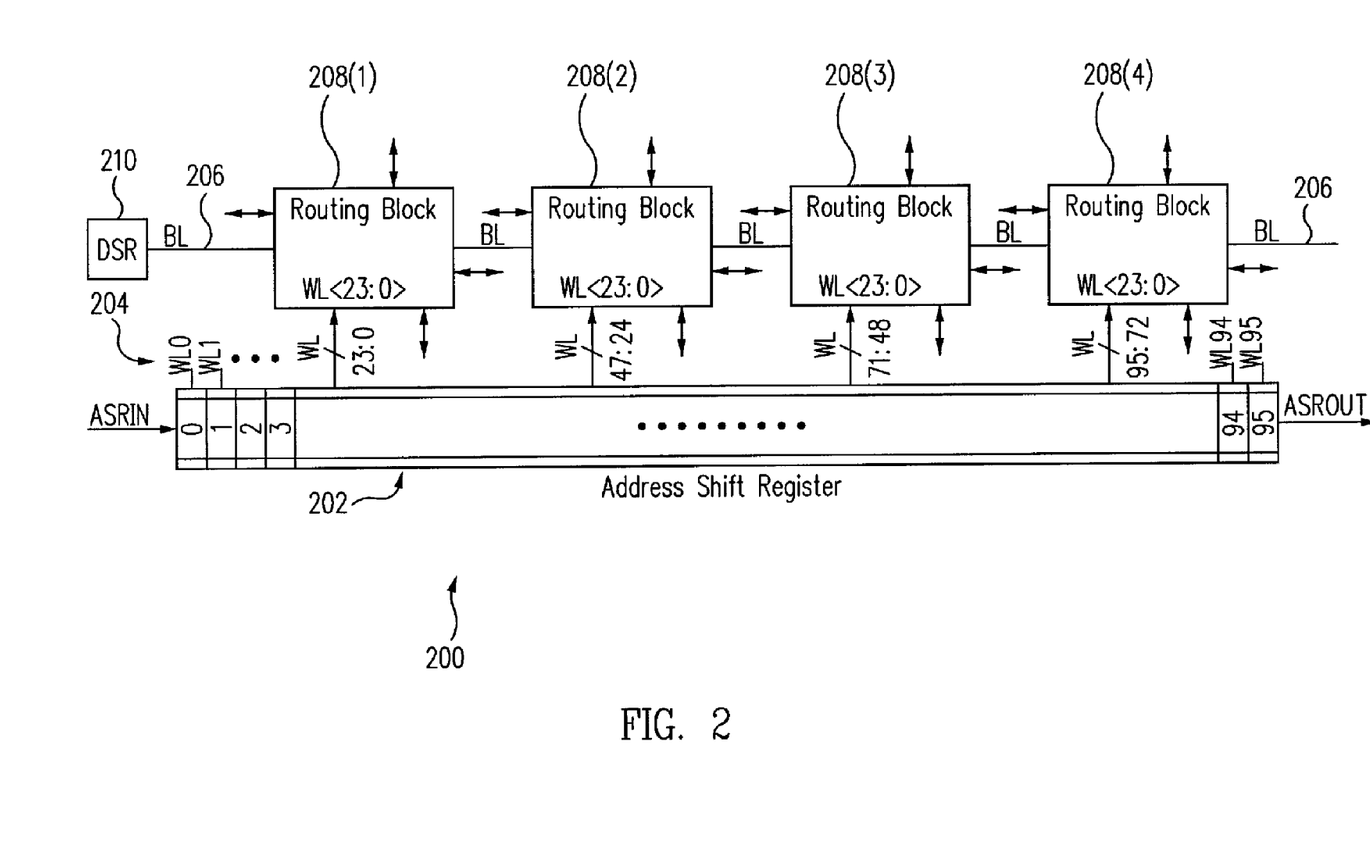
FIG. 2 shows a block diagram illustrating an exemplary implementation of a portion of a routing architecture of the programmable logic device of FIG. 1 in accordance with an embodiment of the present invention.

For example, FIG. 2 shows a block diagram of a circuit 200, which illustrates an exemplary implementation of a portion of interconnect 116 of PLD 100 of FIG. 1 in accordance with an embodiment of the present invention. Circuit 200 includes an address shift register (ASR) 202 and routing blocks 208 (e.g., four of which are shown separately referenced as routing blocks 208(1) through 208(4)).

Routing blocks 208 contain routing multiplexers and fuses (i.e., configuration memory, such as a portion of configuration memory 114). Addresses are shifted through ASR 202 (e.g., address shift register in (ASRIN) and out (ASROUT)), with wordlines 204 (e.g., WL0 through WL95) provided from ASR 202 to the fuses within routing blocks 208, while the fuses receive bitlines 206 from a data shift register (DSR) 210 as would be understood by one skilled in the art. As an example, routing blocks 208(1) through 208(4) receive wordlines<23:0>, wordlines<47:24>, wordlines<71:48>, and wordlines<95:72>, respectively, of wordlines 204.

Figure 3:
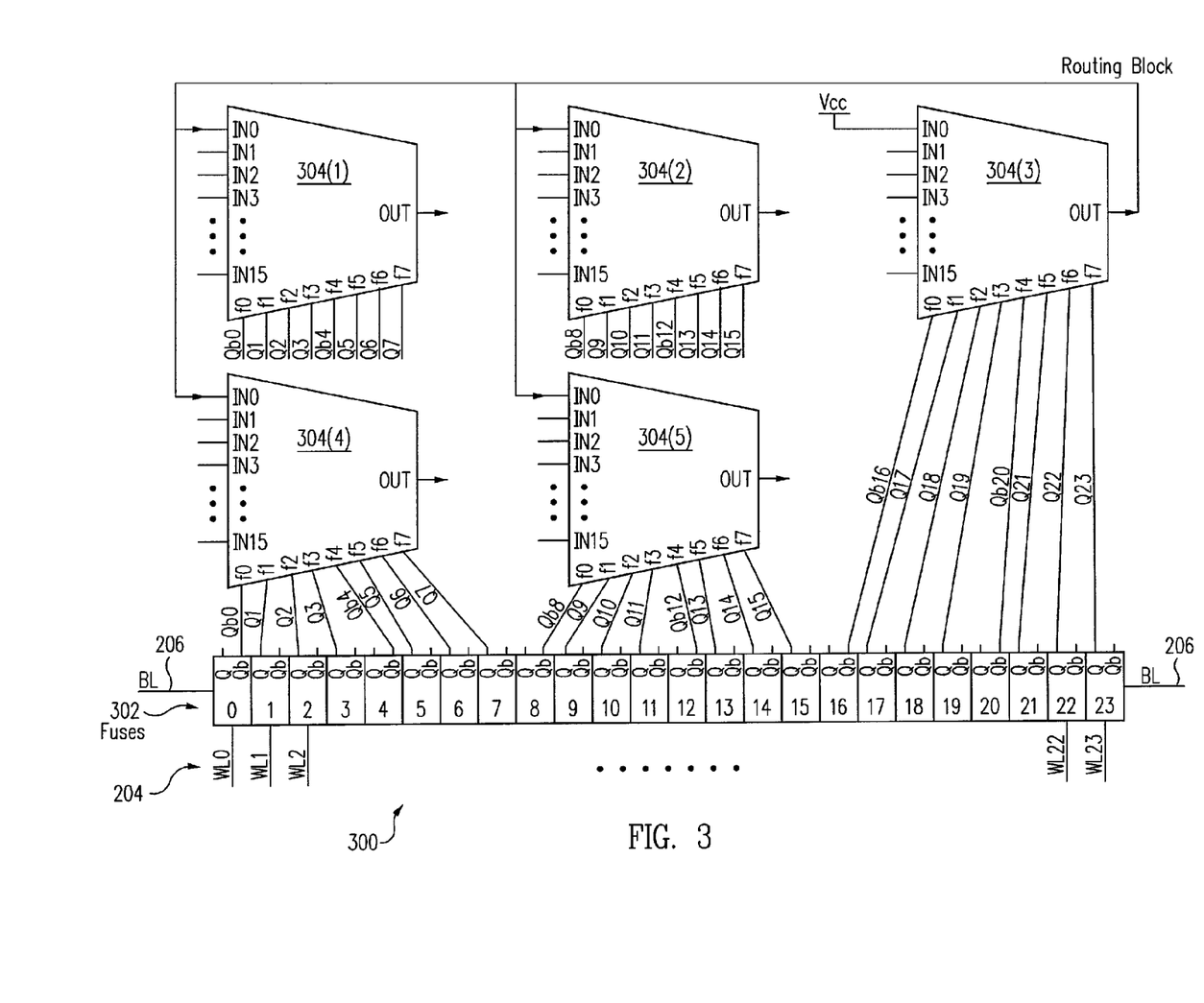
FIG. 3 shows a block diagram illustrating an exemplary implementation of a routing block portion of the routing architecture of FIG. 2 in accordance with an embodiment of the present invention.

As an implementation example, FIG. 3 shows a block diagram of a circuit 300, which illustrates an exemplary implementation of one of routing blocks 208 (e.g., routing block 208(1)) of circuit 200 of FIG. 2 in accordance with an embodiment of the present invention. Circuit 300 includes fuses 302 and multiplexers 304 (e.g., five of which are shown separately referenced as multiplexers 304(1) through 304(5)). As discussed previously, fuses 302 receive wordlines 204 (from ASR 202) and bitlines 206 (from DSR 210), which provide a desired logical value to be stored by fuses 302. Fuses 302 each provide complementary signals (Q and Qb), which can be provided to associated multiplexers 304 at their fuse input terminals (e.g., labeled f0 through f7) to control input signal selection for multiplexers 304 at their input signal terminals (e.g., labeled IN0 through IN15).

Figure 4:
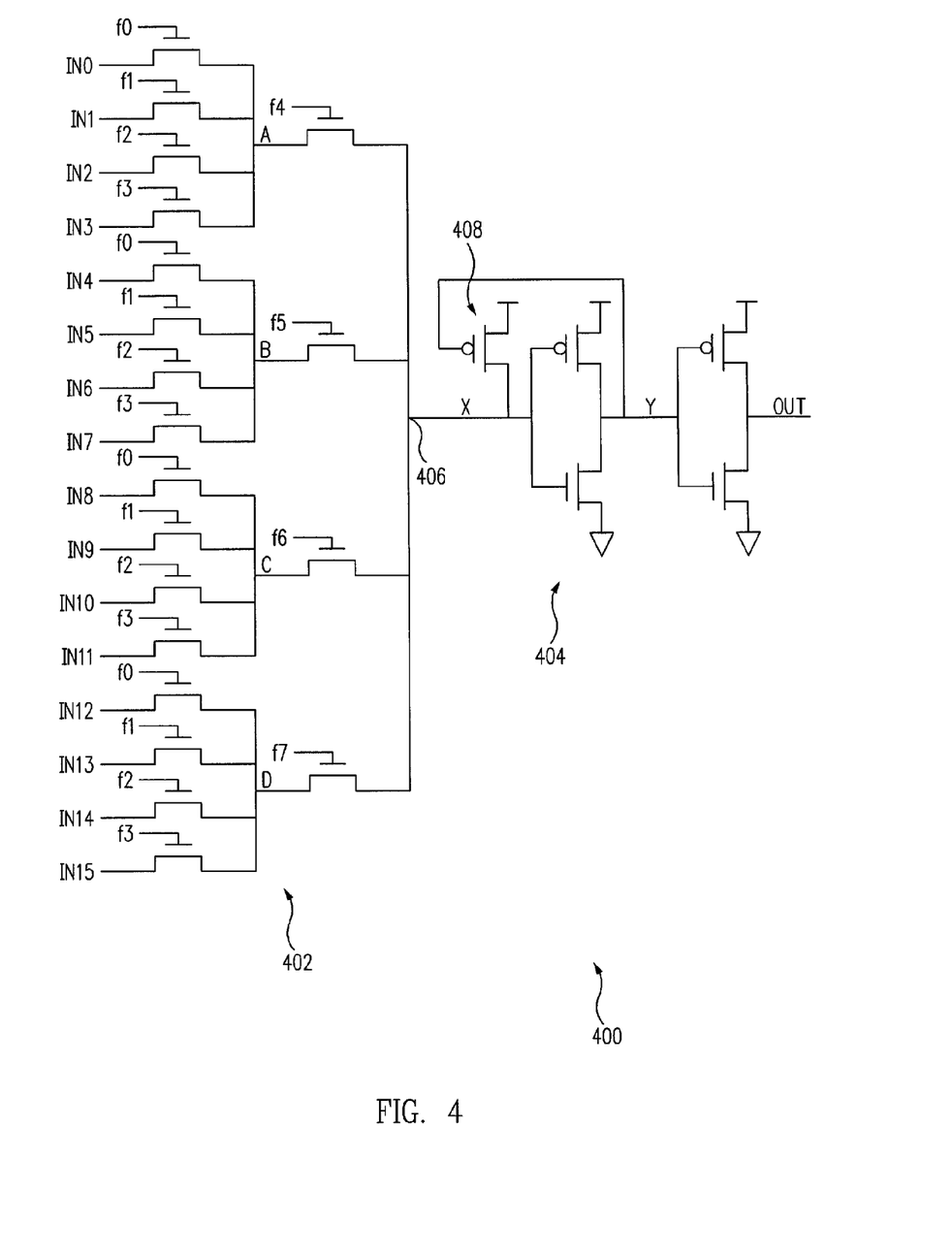
FIG. 4 shows a circuit diagram illustrating an exemplary implementation of a multiplexer for the routing block of FIG. 3 in accordance with an embodiment of the present invention.

As an example and referring briefly to FIG. 4, a diagram of a circuit 400 illustrates an exemplary implementation of multiplexer 304 (e.g., multiplexer 304(4)) for circuit 300 of FIG. 3 in accordance with an embodiment of the present invention. Circuit 400 illustrates a routing multiplexer example formed of two stages of n-channel multiplexer transistors 402 followed by two inverter stages 404. It should be understood that although circuit 400 illustrates a 16-input routing multiplexer controlled by eight fuses (e.g., fuses 0 through 7 of fuses 302), this is not limiting and that any desired size and multiplexer type may be implemented in accordance with an embodiment of the present invention.

In general for circuit 400, a node 406 (labeled X) must be driven to a full logic high (or logic low level) so that leakage current in transistors of inverter stages 404 is minimized. The n-channel multiplexer transistors of circuit 400 can drive a ground (Vss) voltage level (logic low) but not a full supply voltage (Vcc) level and thus, a weak p-channel transistor 408 is connected in a half-latch configuration to pull up node 406.

Upon power-up of the device, in accordance with an embodiment of the present invention, node 406 is to be driven to a full logic level as explained further herein.

As a general example, if one of routing multiplexers 304 is used in a PLD design (i.e., a user's design for the PLD), then one of the input signal terminals of this routing multiplexer 304 will be selected and will always drive node 406 to a full logic level. For routing multiplexers 304 that are unused in the given PLD design, their corresponding node 406 should be driven to a full logic high (or logic low) while minimizing the silicon area required to support the unused routing multiplexers 304, minimizing the dynamic current and leakage current in the unused routing multiplexers 304, and minimizing undesired fanout loading on the routing signals.

Referring generally to FIGS. 2 and 3, circuits 200 and 300 illustrate a simplified diagram of routing multiplexers 304 within routing blocks 208 (e.g., also referred to herein as routing block tiles) and connections of wordlines 204 from ASR 202 to fuses 302 associated with each routing multiplexer 304. In accordance with one or more embodiments of the present invention, techniques are disclosed that utilize certain characteristics of routing multiplexers 304 and their relationship to the programming architecture of the device (e.g., PLD 100).

For example, routing multiplexers 304 may be implemented within routing blocks 208 and have their associated fuses 302 within a compact sub-region of the address space occupied by routing block 208. Because of the routing requirements of the device architecture, at least some of routing multiplexers 304 (referred to herein as "receiver" routing multiplexers) are provided with input signals from the output signals from a small subset of other ones of routing multiplexers 304 (referred to herein as "transmitter" routing multiplexers and which, for example, are within the same routing block 208).

Associated fuses 302 are initially set to their erased state before the actual user design pattern is programmed into the device (e.g., PLD), with the programming performed in sequential address order (e.g., left to right for the exemplary implementation of circuit 300 or right to left or vertical rather than horizontal for a vertical ASR, depending upon the specific implementation). Specifically as an example, fuses 302 associated with "receiver" routing multiplexers 304 are set (programmed) before fuses 302 of the associated "transmitter" routing multiplexers 304 (the drivers of the "default" input signals of "upstream" receiver routing multiplexers 304) and may be confined to a fuse region separate from fuses 302 of the associated "transmitter" routing multiplexers 304 (e.g., the orientation of routing multiplexers 304 may match ASR 202 and the orientation of fuses 302).

As a specific example and in accordance with an embodiment of the present invention, routing multiplexer 304(3) of circuit 300 is provided with the supply voltage (Vcc) as an input signal (e.g., at the input signal terminal IN0). Because fuses 302 provide complementary output signals (Q and Qb), the appropriate output signal from fuses 302 may be selected so that, for example, the default input signal terminal (e.g., input signal terminal (IN0)) of each "receiver" routing multiplexer 304 (e.g., routing multiplexers 304(1), 304(2), 304(4), and 304(5)) and each "transmitter" routing multiplexer 304 (e.g., routing multiplexer 304(3)) is selected when their associated fuses 302 are erased (i.e., the default selected input signal terminal is input signal terminal IN0).

For example and referring to circuits 300 and 400 (FIGS. 3 and 4), the first-stage, n-channel transistors for the corresponding input signal terminals IN0, IN4, IN8, and IN12 have their gates (the "f0" nodes or the fuse input terminal f0) connected to the complemented output of their respective fuse 302 (i.e., the Qb output of that fuse 302), while the remaining first-stage, n-channel transistors have their gates (the nodes or the fuse input terminals "f1" through "f3") driven from the true (uncomplemented) output of their respective fuses 302 (i.e., the Q output). Similarly, one of the second-stage, re-channel transistors has its gate (the "f4" node or the fuse input terminal f4) connected to the complemented output of its respective fuse 302 (i.e., the Qb output of that fuse 302), while the remaining second-stage, n-channel transistors have their gates (the nodes or the fuse input terminals "f5" through "f7") driven from the uncomplemented output of their respective fuses 302 (i.e., the Q output).

By connecting fuses 302 in this arrangement to routing multiplexers 304 for this example, routing multiplexer 304(3) is driven by the supply voltage (Vcc) when its fuses 302 (e.g., fuses 302 numbered 16-23) are in an erased state due to the default selection of input signal terminal IN0. The output signal from routing multiplexer 304(3) provides a logic high signal to routing multiplexers 304(1), 304(2), 304(4), and 304(5) (e.g., other routing multiplexers 304 in its routing block 208) and initializes each of them to a logic high at their node 406 due also to their default selection of input signal terminal IN0.

In general, the interconnection scheme between the various routing multiplexers 304 may already be required by the interconnect architecture and, therefore, no additional input paths/terminals would be required to drive the four "receiver" ("upstream") routing multiplexers 304(1), 304(2), 304(4), and 304(5) to a logical high at their node 406 when fuses 302 are in the erased state. Consequently, the "transmitter" and "receiver" routing multiplexers 304 may be disposed relative to the address space so that the "transmitter" routing multiplexers 304 are downstream of the "receiver" routing multiplexers 304 in the programming sequence.

With routing multiplexers 304 driven to a logic high state when their fuses 302 are in the erased state (e.g., bulk erased), this logic high level may also be maintained in the unused routing multiplexers 304 for a particular design implementation (e.g., user design for implementation within the PLD). For example (referring to FIG. 4), if a stable logic high value is currently being driven into a selected input signal terminal (e.g., IN0), node 406 (X) will remain latched at the logic high when the selected path becomes deselected, provided that no other path becomes selected, due to transistor 408 being connected in a half-latch configuration.

In accordance with an embodiment of the present invention, if the software that generates physical programming data provides that all user designs will switch off every multiplexer input path for unused routing multiplexers 304, then as the device is programmed, each routing multiplexer 304 will either become programmed to select a desired input terminal (i.e., a used routing multiplexer 304) or programmed to deselect all input terminals (i.e., an unused routing multiplexer 304). Consequently, as all routing multiplexers 304 are driven to a logic high level either directly by the supply voltage (Vcc) input or indirectly by the associated "transmitter" routing multiplexer 304, each unused routing multiplexer 304 will simply latch in a logic high level as its fuses 302 are programmed, while each routing multiplexer 304 that is used will select its required input signal terminal.

Figure 5:
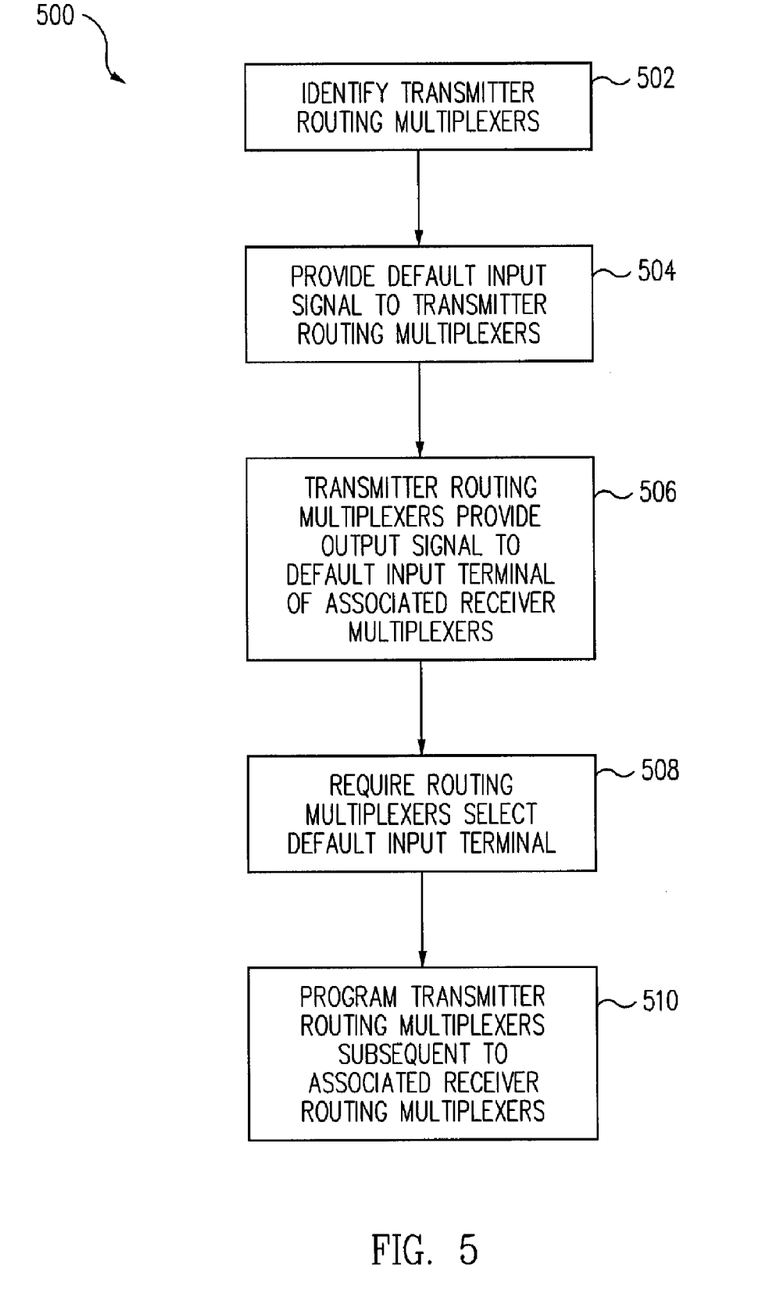
FIG. 5 shows a flowchart illustrating a general technique for multiplexer initialization in accordance with an embodiment of the present invention.

FIG. 5 shows a flowchart 500 illustrating a general procedure for implementing a routing multiplexer technique in accordance with an embodiment of the present invention. Flowchart 500 includes identifying the transmitter routing multiplexers (block 502). For example, the transmitter routing multiplexers, such as routing multiplexer 304(3), provide an output signal to one or more receiver routing multiplexers (e.g., routing multiplexers 304(1), 304(2), 304(4), and 304(5)).

A default input signal is provided to the transmitter routing multiplexers (block 504). For example, the transmitter routing multiplexers may be provided with the supply voltage (Vcc) at their default input terminal. The transmitter routing multiplexers provide corresponding output signals to the default input terminal of their associated receiver multiplexers (block 506). Furthermore, when fuses 302 are in the erased state (or a default state), all routing multiplexers are set to select their default input signal terminal (block 508). Consequently when fuses 302 are in the erased state, as an example, the transmitter routing multiplexers would by default select the supply voltage (Vcc) signal at their default input terminal, while the receiver routing multiplexers would by default select the output signal (at their default input terminal) provided by their associated transmitter routing multiplexer (e.g., all multiplexers select their proper input when fuses 302 are in a bulk-erased condition).

Fuses 302 of the transmitter routing multiplexers should be programmed after the fuses 302 of the associated receiver routing multiplexers (block 510). For example, the transmitter routing multiplexers may be placed physically "downstream" from their associated "upstream" receiver routing multiplexers that are being driven so that fuses 302 are programmed appropriately in a sequential fashion (e.g., from the "upstream" to the "downstream" direction to provide proper routing multiplexer initialization). Therefore, routing multiplexer initialization may be achieved without adding additional transistors to the routing multiplexers as with some conventional approaches. Furthermore, once the fuses are programmed, all unused routing multiplexers will be fully off, with their nodes 406 latched in a low leakage current state and with no additional undesired fanout on the routing signals.

Systems and methods are disclosed herein to provide multiplexer initialization techniques. For example, in accordance with an embodiment of the present invention, a multiplexer initialization technique is disclosed that may provide an efficient, power-saving connection and initialization scheme for PLD routing multiplexers that may minimize the dynamic current and leakage current in the PLD, may minimize undesired fanout on routing signals, and may use minimum silicon area to implement.

For example in accordance with an embodiment, through proper organization of the routing multiplexers within a routing block and through proper multiplexer control fuse connections, a specific input (the "default" input) of each routing multiplexer will be selected whenever the device is bulk erased. The "default" input of each routing multiplexer is either driven by a full-time supply voltage (Vcc) connection or by the output of another routing multiplexer that is driving a logic high value.

For the PLD example, the PLD software generates user fuse patterns such that unused routing multiplexers are completely off (i.e., no inputs are selected). At power-up or when the PLD is reprogrammed, all of the fuses are first bulk erased and the default inputs of all routing multiplexers are selected and thus, the routing multiplexers are in their logic high state. As the PLD is programmed (e.g., sequentially row-by-row in the address space), all routing multiplexers are programmed as the actual user design requires, with each routing multiplexer that is used in the design selecting its proper input and each unused routing multiplexer deselecting all inputs. Therefore, the high logic value that was being driven to node 406 during the bulk-erase state will be latched into the unused routing multiplexers when all inputs are deselected. Each unused routing multiplexer may then be in its minimum-leakage state and will remain so until power is lost or the PLD is reconfigured.

Embodiments described above illustrate but do not limit the invention. It should also be understood that numerous modifications and variations are possible in accordance with the principles of the present invention. For example, although fuses are disclosed for providing selection control signals to the multiplexers, it should be understood that other known techniques for providing selection control signals to the multiplexers may be implemented. Accordingly, the scope of the invention is defined only by the following claims.

What is claimed is:

1. A programmable logic device comprising:
 a plurality of multiplexers, with each of the multiplexers having fuse input terminals and input signal terminals;
 a plurality of fuses associated with the plurality of multiplexers and adapted to provide fuse signals to the fuse input terminals to control selection of the input signal terminals; wherein the fuses in a first state select a first input signal terminal of the input signal terminals;
 an address shift register adapted to provide wordlines to the plurality of fuses; and
 a data shift register adapted to provide bitlines to the plurality of fuses,
 wherein, with the fuses in the first state, a first multiplexer from the plurality of multiplexers is adapted to receive a first logic level signal at the first input signal terminal and provide the first logic level signal to the first input signal terminal of a first set of the plurality of multiplexers, and the fuses are disposed relative to the address shift register such that the fuses associated with the first set of multiplexers are programmed before the fuses associated with the first multiplexer.

2. The programmable logic device of claim 1, wherein the fuses associated with unused multiplexers of the plurality of multiplexers for a user design for the programmable logic device are adapted to be programmed to not select any of the input signal terminals.

3. The programmable logic device of claim 1, wherein the fuses associated with unused multiplexers of the plurality of multiplexers for a user design for the programmable logic device are adapted to be programmed to not select any of the input signal terminals, and wherein the unused multiplexers latch and provide the first logic level signal.

4. The programmable logic device of claim 1, wherein each of the fuses is adapted to provide complementary fuse signals.

5. The programmable logic device of claim 1, wherein the first state of the fuses is an erased state, and wherein the first logic level signal is a logic high signal level.

6. The programmable logic device of claim 1, wherein each of the plurality of multiplexers comprise:
 at least one stage of transistors;
 at least one inverter stage coupled to the at least one stage of transistors; and
 at least one latch transistor coupled to the at least one inverter stage and adapted to latch the first logic level signal.

7. The programmable logic device of claim 1, further comprising:
 a plurality of programmable logic blocks;
 configuration memory adapted to store configuration data to configure the programmable logic blocks;

a volatile memory block adapted to store information during operation of the programmable logic device;

a non-volatile memory block adapted to store configuration data for transfer to the configuration memory to configure the programmable logic blocks;

input/output blocks adapted to transfer information into and out of the programmable logic device; and an interconnect configured based on the configuration data stored in the configuration memory and adapted to provide routing resources between the volatile memory block, the input/output blocks, and the programmable logic blocks.

8. The programmable logic device of claim 7, wherein the fuses are formed as a portion of the configuration memory.

9. The programmable logic device of claim 7, wherein the plurality of multiplexers are formed as a portion of the interconnect.

10. A routing block for a programmable logic device including:

a plurality of multiplexers, with each of the multiplexers having fuse input terminals, input signal terminals, and an output signal terminal;

a first multiplexer from the plurality of multiplexers having a first input signal terminal adapted to receive a first logic level signal and having an output signal terminal coupled to a first input signal terminal of each of the other multiplexers of the plurality; and a plurality of fuses associated with the plurality of multiplexers and adapted to provide fuse signals to the fuse input terminals to control selection of the input signal terminals, the fuses having an erased state and a programmed state;

wherein the fuses in the erased state select the first input signal terminals of the multiplexers so as to provide the first logic level signal received at the first input signal terminal of the first multiplexer to the first input signal terminals of the other multiplexers; and wherein in subsequent programming of the fuses from the erased state to the programmed state, the first multiplexer is adapted to be programmed after the other multiplexers are programmed so as to maintain the logic state of the first logic level signal at the first input signal terminal of the other multiplexers at least until the other multiplexers are programmed.

11. The routing block of claim 10, wherein the fuses are adapted to be placed in the programmed state by an address shift register and a data shift register in the programmable logic device, the address shift register adapted to provide wordlines to the plurality of fuses and the data shift register adapted to provide bitlines to the plurality of fuses.

12. A method of programming a routing block of a programmable logic device, comprising:

applying a first logic level signal to an input signal terminal of a first multiplexer in the routing block;

putting fuses in the routing block in an erased state to cause the first multiplexer to select the first logic level signal as an output signal and to cause other multiplexers in the routing block to receive at an input signal terminal the first logic level signal from the first multiplexer; and programming the fuses in an order that first programs the other multiplexers with a user design and then programs the first multiplexer with the user design so as to maintain the logic state of the first logic level signal at the input signal terminals of the other multiplexers at least until the other multiplexers are programmed.

13. The method of claim 12, wherein fuses associated with unused multiplexers, for the user design are programmed to not select any of the input signal terminals of the unused multiplexers.

14. The method of claim 12, wherein the first logic level signal that is applied is a supply voltage for the programmable logic device.

15. The method of claim 12, wherein programming the fuses in the routing block includes addressing the fuses through wordlines of an address shift register in the programmable logic device and providing bits to the fuses through bitlines of a data shift register in the programmable logic device.

16. A computer readable medium on which is stored a computer program which when executed by a computer performs a method of programming a routing block of a programmable logic device, the method comprising:

applying a first logic level signal to an input signal terminal of a first multiplexer in the routing block;

putting fuses in the routing block in an erased state to cause the first multiplexer to select the first logic level signal as an output signal and to cause other multiplexers in the routing block to receive at an input signal terminal the first logic level signal from the first multiplexer; and programming the fuses in an order that first programs the other multiplexers with a user design and then programs the first multiplexer with the user design so as to maintain the logic state of the first logic level signal at the input signal terminals of the other multiplexers at least until the other multiplexers are programmed.

17. The method of claim 16, wherein fuses associated with unused multiplexers for the user design are programmed to not select any of the input signal terminals of the unused multiplexers.

18. The method of claim 16, wherein the first logic level signal that is applied is a supply voltage for the programmable logic device.

19. The method of claim 16, wherein programming the fuses in the routing block includes addressing the fuses through wordlines of an address shift register in the programmable logic device and providing bits to the fuses through bitlines of a data shift register in the programmable logic device.

20. A routing block for a programmable logic device including:

a plurality of multiplexers, with each of the multiplexers having fuse input terminals, input signal terminals, and an output signal terminal;

a first multiplexer from the plurality of multiplexers having a first input signal terminal adapted to receive a first logic level signal and having an output signal terminal coupled to a first input signal terminal of each of the other multiplexers of the plurality;

a plurality of fuses associated with the plurality of multiplexers and adapted to provide fuse signals to the fuse input terminals to control selection of the input signal terminals, the fuses having an erased state and a programmed state, wherein the fuses in the erased state are adapted to select the first input signal terminals of the multiplexers; and an address shift register for programming the plurality of fuses, wherein the fuses are disposed relative to the address shift register such that the fuses associated with the first multiplexer are adapted to be programmed after the fuses associated with the other multiplexers are programmed.

21. The routing block of claim 20, wherein the first input terminal of the first multiplexer is adapted to receive a supply voltage of the programmable logic device as the first logic level signal.

22. The routing block of claim 10, wherein the first input terminal of the first multiplexer is adapted to receive a supply voltage of the programmable logic device as the first logic level signal.

* * * * *